United States Patent [19]

Grabmaier

[11] 4,357,200

[45] Nov. 2, 1982

[54] METHOD FOR PRODUCING PLATE-, TAPE- OR FILM-SHAPED SI CRYSTAL BODIES FOR SOLAR CELLS

[75] Inventor: Christa Grabmaier, Berg, Fed. Rep. of Germany

[73] Assignee: Siemens Aktiengesellschaft, Berlin & Munich, Fed. Rep. of Germany

[21] Appl. No.: 261,780

[22] Filed: May 8, 1981

[30] Foreign Application Priority Data

May 22, 1980 [DE] Fed. Rep. of Germany ....... 3019653

[51] Int. Cl.³ ............................................. C30B 29/06
[52] U.S. Cl. ..................................... 156/603; 29/572; 136/258; 156/605; 156/DIG. 88; 264/60; 264/61; 264/62; 264/63; 264/66; 427/74; 427/85; 427/86
[58] Field of Search .......................... 29/572; 136/258; 156/603, 605, DIG. 88; 264/60–63, 66; 427/74, 85, 86

[56] References Cited

U.S. PATENT DOCUMENTS

| | | | |
|---|---|---|---|
| 2,904,613 | 9/1959 | Paradise | 136/250 |
| 3,900,943 | 8/1975 | Sirtl | 136/258 |
| 4,021,323 | 5/1977 | Kilby et al. | 29/572 |
| 4,027,053 | 5/1977 | Lesk | 427/86 |
| 4,173,494 | 11/1979 | Johnson et al. | 427/74 |
| 4,233,338 | 11/1980 | Ricard | 427/86 |
| 4,238,436 | 12/1980 | Hill | 427/86 |

FOREIGN PATENT DOCUMENTS 2508803 9/1976 Fed. Rep. of Germany .
2624756 12/1977 Fed. Rep. of Germany ........ 427/86

OTHER PUBLICATIONS

Fang et al., "Polycrystalline Silicon Films . . . for Solar Cell Application", Applied Physics Letters, vol. 25, No. 10, Nov. 1974.
Rosenblatt, "Energy Crisis—Power Sources", *Electronics,* pp. 99–111 (Apr. 1974).

*Primary Examiner*—John D. Smith
*Attorney, Agent, or Firm*—Hill, Van Santen, Steadman, Chiara & Simpson

[57] ABSTRACT

Large surfaced, pore-free silicon bodies useful for processing into solar cells are produced by providing at least two layers formed from at least two distinct silicon materials, each containing different amounts of germanium therein and thus having different melting points. A laminate is formed of such layers and sintered at a temperature at which only one of the silicon materials becomes molten so that the resultant molten layer effectively seals the pores of the other layers and upon cooling a unitary silicon body is attained. In certan embodiments, a molten silicon material is applied as a liquified film onto a solidified layer composed of different silicon material.

9 Claims, 3 Drawing Figures

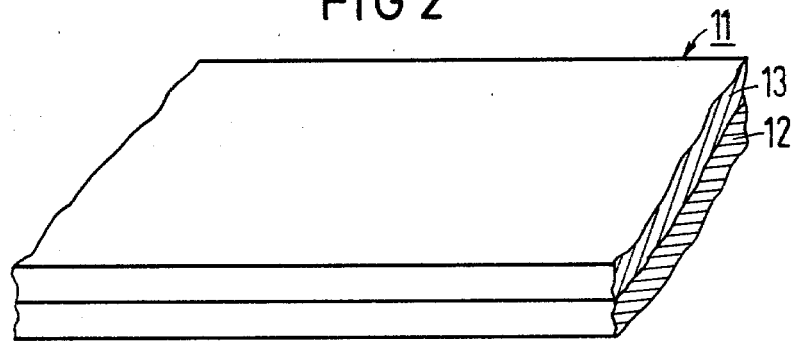
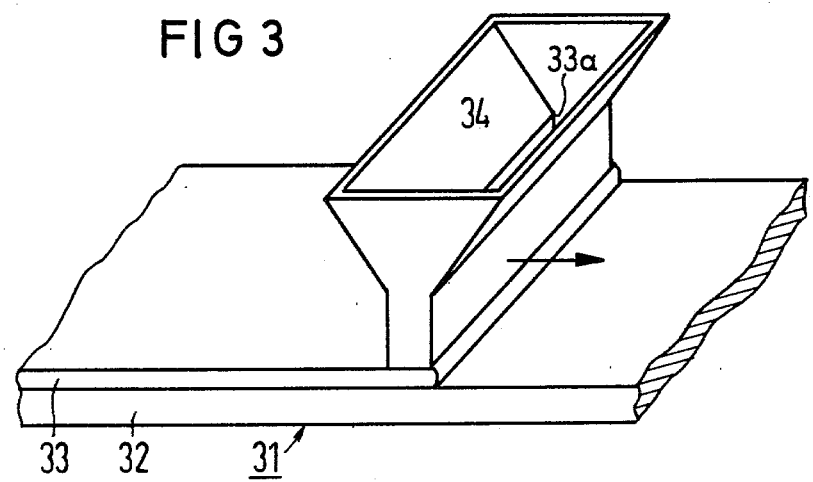

METHOD FOR PRODUCING PLATE-, TAPE- OR FILM-SHAPED SI CRYSTAL BODIES FOR SOLAR CELLS

CROSS-REFERENCE TO RELATED APPLICATION

Attention is directed to co-pending C. Grabmaier et al application for patent, Ser. No. 160,214, filed June 17, 1980, now U.S. Pat. No. 4,330,358 assigned to the instant assignee and incorporated herein by reference.

BACKGROUND OF THE INVENTION

1. Field of the Invention

The invention relates to a process of producing silicon bodies for solar cells and somewhat more particularly to an improved process for producing plate-, tape-, or film-shaped Si crystal bodies having crystalline pillar-like structures therein, which are equivalent to crystalline columnar structures, and which bodies are useful for further processing into large-surface solar cells.

2. Prior Art

The process disclosed in the above-referenced Grabmaier et al application relates to manufacture of plate-shaped or tape-shaped Si crystal bodies having crystalline pillar-like structures therein, equivalent to crystalline columnar structures, and which bodies are useful, preferably for processing into solar cells.

As is known from prior art publications, a number of methods for producing Si crystal bodies for solar cells are known. However, these methods are typically too costly, in particular because they require sawing of a Si body produced in accordance with conventional crystal growth techniques, which are known per se, to an appropriate crystal disc required for solar cells.

The earlier referenced Grabmaier et al application discloses a process for producing Si crystal bodies which, during the manufacture thereof, are already in the form of plates, tapes or films and have crystalline pillar-like structures therein, equivalent to crystalline columnar structures, so that such bodies can readily be further processed to completion into finished large-surface solar cells. The Grabmaier et al process occurs without melting of the base or starting materials forming the Si bodies. The starting materials comprise a Si powder having an average particle diameter in the range of less than about 1 $\mu$m, which is admixed with a suitable binder, such as aqueous polyvinyl alcohol, and optional additives, to form a slurry. This slurry is extruded onto an inert support member as a relatively thin film or the like via an extrusion means, such as a doctor-blading tool, dried in air so as to form a self-supporting layer so that the support can be removed. The dried slurry layer is then placed on a temperature-resistant inert base and sintered in a protective gas atmosphere at a sintering temperature below about 1430° C. in such a manner that a layer or film is generated having monocrystalline silicon particles therein with an average particle diameter corresponding to the thickness of the sintered layer. In certain embodiments of this Grabmaier et al process, sintering aids, such as germanium, can be added to the silicon powder in an amount up to a maximum of about 5% by weight. Further, during sintering, the heat distribution within the sintering furnace is preferably so adjusted that a temperature gradient is attained in the thickness direction of the film or layer being sintered. The support base for the sintering step is preferably composed of quartz glass and is provided with a periodic spacing of crystallization seed centers which promote formation of the desired crystalline pillar structures. Such seed centers can be peak-shaped elevations uniformly spaced at intervals matched to the desired crystalline columnar or pillar structures of the silicon material. Select dopants, for example, arsenic and/or boron, along with any sintering aids, in the form of an arsenic-containing or boron-containing germanium alloy, can be added during slurry formation so as to be substantially uniformly distributed throughout the formed Si crystalline body. Such doped Si bodies are especially useful for fabrication into solar cells.

The manufacturing process disclosed in the above referenced Grabmaier et al application is particularly economical when work is carried out in a continuous manner whereby during extrusion of the silicon layer or film with a stationary extrusion shoe (or doctor-blading tool), the underlying support base is moved in a given direction at a preselected speed. Prior to actual sintering, the extruded tape-shaped silicon layer or film can be divided into individual plates or tiles corresponding to desired dimensions of solar cells to be produced therefrom. In this manner, not only is sawing of elongated crystalline Si bodies into discs or plates eliminated, but also the division of such body into Si plates of a select size can occur prior to sintering.

In the foregoing process, sintering of the Si slurry layer into Si crystalline bodies occurs at temperatures below the melting point of Si (1430° C.). Under these conditions and with appropriate heat distribution within the sintering furnace, larger crystals grow at the expense of smaller crystals at an orientation essentially parallel to the thickness dimension of the Si layer. The same effect can also be attained with the aid of a support member composed, for example, of quartz glass, and having the earlier described periodicity of singularities, particularly peak-shaped elevations, which together with a suitably matched heat distribution, initiate crystal growth on the contact surface between the support member and the Si layer positioned thereon and favors the desired crystalline pillar or columnar structures in the thickness dimension of the Si layer.

SUMMARY OF THE INVENTION

The present invention provides an improved method of producing plate, tape or film-shaped Si bodies, relative to the earlier referenced Grabmaier et al process whereby the produced Si body is as free of pores as possible or is more densely sintered, relative to that obtainable via the earlier described Grabmaier et al process.

In accordance with the principles of the invention, the referenced Grabmaier et al process is improved by producing two distinct layers, a first of which is composed of a material having the formula (Si+xGe) wherein x is a numeral in the range of 0 to 5 gram atomic percent and the second of which is composed of a material having the formula [Si+(x+y)Ge] wherein x is a numeral in the range of 0 to 5 gram atomic percent and y is a numeral greater than 0 and ranging up to 5 gram atomic percent so that the material of the second layer has a melting point different from the material forming the first layer; positioning such layers one on top of the other, sintering the resultant layers at a temperature corresponding to that at which the material of the second layer attains a molten state and cooling the resultant structure to attain a unified Si body.

In certain embodiments of the invention, an unsintered solidified layer or a sintered solidified layer composed of a material having the formula (Si+xGe) wherein x is a numeral in the range of 0 to 5 gram atomic percent is coated with a relatively thin film of a molten silicon material. The molten silicon material can be applied during sintering of the underlying layer. The molten silicon material can be composed of a material having the formula [Si+(x+y)Ge] wherein x is a numeral in the range of 0 to 5 gram atomic percent and y is a numeral in the range of 0 to 5 gram atomic percent.

BRIEF DESCRIPTION OF THE DRAWINGS

FIG. 2 is an elevated, partially cross-sectioned and somewhat schematic view of an exemplary embodiment of the invention; and FIG. 3 is an elevated, partially cross-sectioned and somewhat schematic view of another exemplary embodiment of the invention, in the process of manufacture thereof.

DESCRIPTION OF PREFERRED EMBODIMENTS

Figure 1:
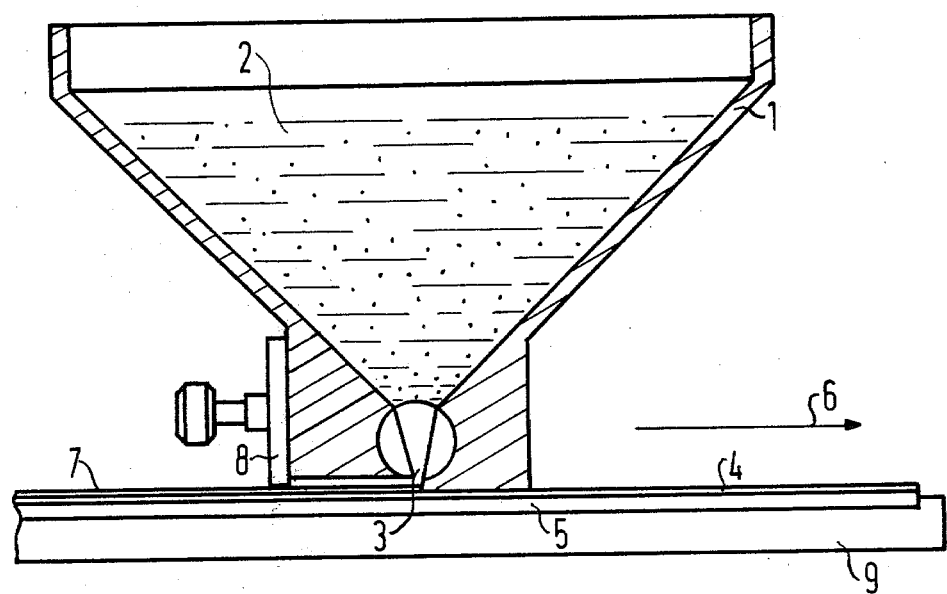
FIG. 1 is an elevated, partially cross-sectioned and somewhat schematic view of an apparatus arrangement useful for practicing the invention.

FIG. 1 illustrates, in principle, a layer extruding means or doctor-blading tool useful in practicing the earlier-referenced Grabmaier et al process and which is generally known for manufacture of electro-ceramics.

A funnel 1, having an adjustable outlet valve 3, is provided with a silicon slurry 2, for example, attained by admixing about 50 grams of silicon powder (having particles with an average grain diameter less than about 1 $\mu$m) with about 30 cubic centimeter of aqueous polyvinyl alcohol (about 5% polyvinyl alcohol, by volume). The silicon slurry can also contain sintering aids which, for example, contain up to a maximum of about 5% by weight germanium (based on the total weight of silicon particles in the slurry) and which can also contain a select dopant for a desired doping of the ultimately attained silicon body. For example, such dopant-sintering aids can comprise arsenic-containing germanium alloys or boron-containing germanium alloys. The slurry 2 is extruded or exits from funnel 1 via an adjustable outlet valve 3 which, for example, can be adjusted to provide an opening of about 0.4 mm, onto a first inert support member. In an exemplary embodiment, the support member comprises a glass plate 5 coated with a 300 $\mu$m thick Hostaphan ( a commercially available polyethylene terephthalate) film. The first inert support member is positioned within an under-part or base 9 associated with the doctor-blading tool and the upper part of this tool is controllably moveable in the direction of arrow 6 so that a slurry layer 7 in a thickness of about 150 $\mu$m is extruded or deposited on the upper surface of the support member. An adjustable doctor-blade means 8 can be provided to meter the slurry and insure the attainment of uniform layer thickness.

After drying in air or in an infrared heater, the slurry layer 7 becomes self-supporting and stable so that it is relatively easy to process further as required. After drying, the Hostaphan film 4 is removed from layer 7 and the now free, solidified silicon slurry layer is ready for sintering on a second inert temperature-stable support member, for example, composed of a quartz glass in a protective atmosphere, such as argon, at a temperature range extending from about 1350° C. to below 1430° C. for at least about 15 minutes. During sintering, the relatively small silicon particles having a diameter of less than about 1 $\mu$m, consolidate and become so large that particles having a diameter larger than the slurry layer thickness (150 $\mu$m) are attained. This grain growth can be controlled by the sintering aids mentioned earlier, which are present in the slurry undergoing sintering, as a liquid phase. It will be appreciated that such sintering aids must be distributed as homogeneously as possible in the slurry material. In instances where a dopant is added along with a sintering aid, both of which are admixed with the silicon particles and liquid binder to form a substantially homogeneous slurry, the distribution coefficient of such dopant is higher in the liquid phase than in the growing silicon particles so that an enrichment of the dopant is attained at the growing grain or particle boundaries. In this manner, a substantially homogeneous distribution of the dopant is attained within the silicon layer which is formed from such slurry. In an exemplary embodiment, when n-doped silicon bodies are desired, an arsenic-containing germanium alloy (having a maximum of about 1% by weight of As therein) is added to the slurry material and when p-doped silicon bodies are desired, a boron-containing germanium alloy (having a maximum of about 1% by weight of B therein) is added to the slurry material. Such bodies can be produced in a select random size and p-n junctions can be attained therein by diffusing-in a dopant of the opposing conductivity type.

The principles of the invention, when combined with the above teachings, provide the process of producing sintered silicon bodies for solar cells which are, essentially, pore-free.

The principles of the invention involve forming Si bodies with the aid of a laminate composed of at least two distinct layers of silicon materials, each containing different amounts of germanium therein so that one of such layers effectively seals the pores of the other layer during the manufacture of bodies from such layers. The inventive process utilizes at least two successive layers composed of at least somewhat different materials to form a laminate. In this manner, the melting point of a material forming a given layer is below the maximum temperature utilized for sintering the material of the other layer.

An exemplary embodiment of the invention comprises applying a material of a particular layer (which is to be provided as a second or additional layer onto a first or under-layer produced with, for example, the aid of the arrangement described in conjunction with FIG. 1), in the form of a relatively thin liquified film onto a solidified layer, which is to be heated only sufficiently for sintering. With this embodiment, processing steps are saved in that the second or additional layer does not have to be first produced (for example, via the earlier described extrusion, drying, etc., process) and then positioned on a first or underlying layer in order to heat the second layer sufficiently to attain a molten film.

FIG. 2 illustrates an exemplary body section 11 produced in accordance with the principles of the invention. As shown, body 11 is a laminate comprised of a first layer 12 and a second layer 13. The first layer 12 is composed of a material having the formula (si+xGe) wherein x is a numeral in the range of 0 to 5 gram atomic percent. The second layer is composed of a material having the formula [Si+(x+y)Ge] wherein x is a numeral in the range of 0 to 5 gram atomic percent and y is a numeral greater than 0 and ranging up to 5 gram atomic percent, with the proviso that the sum of x and y is not substantially greater than about 5 gram atomic percent. These layers can be formed with the aid of an arrangement as illustrated in FIG. 1.

The lower quantitative value for y, that is the excess amount of germanium in a second or additional layer, such as layer 13 above, is so selected that the melting temperature of the resulting material forming such second or further layer is below the sintering temperature utilized for sintering a first or underlying layer (typically just below 1430° C.). Typically, for this purpose, y can be approximately equal to 1 gram atomic percent.

When a laminate of at least two such layers is subjected to sintering conditions, the material of the second or further layer becomes just barely molten while the material of the first or under-layer attains only a sintered state. A higher heating of the laminate is avoided so that the body which results from sintering the first layer is maintained in form while its inevitably present sintering pores are filled with the liquid material of the upper or second layer. The melting point of the material forming the second or additional layer can approach the sintering temperature for the material forming the first layer up to within about 1° C. For example, when a first layer is formed of a Si material without any germanium therein, i.e., when x is 0, the sintering temperature is just below 1430° C. and the melting point of the material forming a second layer can be just below this sintering temperature. In the exemplary embodiment described in conjunction with FIG. 2, layers 12 and 13 preferably have a thickness in the range of about 100 to 200 μm and can be prepared as set forth in conjunction with FIG. 1.

FIG. 3 illustrates an exemplary arrangement useful in practicing certain embodiments of the invention. As shown, a first layer 32 composed of a silicon material having the formula (Si+xGe) with x having the value earlier indicated and which can already sintered or merely self-supporting and not yet sintered, is positioned in working relation with a crucible means 34 containing a molten material 33a therein. A valve-controlled outlet can be provided along a bottom edge of the crucible means 34 so that a select amount of molten material can be substantially uniformly applied onto the upper surface of layer 32. Preferably, the molten material 33a is composed of a silicon material having the formula [Si+(x+y)Ge] with x having the values earlier indicated and y is in the range of 0 to 5 gram atomic percent. In this manner, a relatively thin layer 33 is applied onto the layer 32 to form a laminate, which can then be sintered and cooled to form a desired unified body. Further, this coating process can occur within a sintering furnace so that coating and sintering occur in rapid succession and with increased energy efficiency. As with the earlier described exemplary embodiment, with the present embodiment, a filling of any pores in layer 32 occurs with the application of the molten silicon-germanium material. By coating the layer 32 relatively rapidly with layer 33 (optionally, a cooling means can be provided for layer 32), a self-supporting pore-free silicon body 31 useful, for example, for fabrication into solar cells is readily attained.

The crucible means 34 can be similar in operating principle to a tool for doctor-blading, such as described in FIG. 1 and relative motion between the crucible means 34 and the underlying layer 32 (schematically illustrated by the arrow) can be provided so as to attain a continuous coating process. Further details for extruding or coating molten silicon material onto a base in the form of a layer can be obtained from co-pending J. Grabmaier application for patent, Ser. No. 238,943, filed Feb. 27, 1981, assigned to the instant assignee and incorporated herein by reference.

In the exemplary embodiment described in conjunction with FIG. 3, layer 32 preferably has a thickness in the range of about 100 to 200 μm and layer 33 preferably has a thickness of about 100 μm and less.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a method of producing plate-, tape- or film-shaped Si crystal bodies having crystalline pillar structures therein, which are essentially equivalent to crystalline columnar structures, without melting of the base material which forms such Si bodies and which bodies are useful for further processing into large-surface solar cells, which includes the steps of:
    (a) forming a slurry from an admixture of a Si powder having an average particle size in the range of less than about 1 μm, optional additives and a compatible liquid binder;
    (b) extruding such layer with an extrusion means onto a first inert support member as a relatively thin slurry layer, which is dried into a self-supporting layer and removing the support member; and
    (c) sintering the self-supporting layer on a temperature-stable second inert support member in a protective gas atmosphere at a sintering temperature ranging from about 1350° C. to below about 1430° C. in such a manner that a layer of Si crystal particles is generated, each particle having an average particle diameter substantially corresponding to the thickness of the self-supporting layer;

the improvement comprising:

forming at least two layers in accordance with steps (a) and (b) from different silicon materials, with a first layer being formed from a first silicon material having the formula (Si+xGe) wherein x is a numeral ranging from 0 to 5 gram atomic percent and a second layer being formed from a second silicon material having the formula [Si+(x+y)Ge] wherein x is a numeral ranging from 0 to 5 gram atomic percent and y is a numeral greater than 0 and ranging up to 5 gram atomic percent, with the proviso that y has such a value that said second material has a melting point enough below that of said first sintering material;

positioning said layers onto one another and subjecting the resultant stack to sintering in accordance with step (c) at a temperature at which only said second silicon material becomes molten; and cooling the sintered structure to obtain a unitary Si body.

2. In a method as defined in claim 1 wherein y is about 1 gram atomic percent.

3. In a method of producing plate-, tape- or film-shaped Si crystal bodies having crystalline pillar structures therein, which are essentially equivalent to crystalline columnar structures, without melting of the base material which forms such Si bodies and which bodies are useful for further procesing into large-surface solar cells, which includes the steps of:
(a) forming a slurry from an admixture of a Si powder having an average particle size in the range of less than about 1 μm, optional additives and a compatible liquid binder;
(b) extruding such layer with an extrusion means onto a first inert support member as a relatively thin slurry layer, which is dried into a self-supporting layer and removing the support member; and
(c) sintering the self-supporting layer on a temperature-stable second inert suport member in a protective gas atmosphere at a sintering temperature ranging from about 1350° C. to below about 1430° C. in such a manner that a layer of Si crystal particles is generated, each particle having an average particle diameter substantially corresponding to the thickness of the self-supporting layer;

the improvement comprising:
applying a substantially uniform liquified film of a molten silicon material onto an entire surface of a solidified layer, said molten silicon material having the formula [Si+(x+y) Ge] wherein x is numeral ranging from 0 to 5 gram atomic percent and y is a numeral greater than 0 and ranging up to 5 gram atomic percent, said solidified material being composed of a silicon material having the formula (Si+xGe) wherein x is a numeral ranging from 0 to 5 gram atomic percent, said solidified layer being produced at least in accordance with steps (a) and (b); and cooling the resultant structure to attain a unified Si body.

4. In a method as defined in claim 3 wherein said solidified layer is sintered in accordance with step (c) prior to application of said liquified film.

5. In a method as defined in claim 4 wherein during application of said liquified film, said solidified layer is cooled.

6. In a method as defined in claim 3, wherein said application of said liquified film occurs during sintering of said solidified layer.

7. In a method as defined in claim 3 wherein said solidified layer has a thickness in the range of about 100 to 200 μm.

8. In a method as defined in claim 7 wherein said liquified film is applied in a thickness less than about 100 μm.

9. In a method as defined in claim 3, wherein said liquified film is applied in a continuous manner on said solidified layer.

* * * * *